(12) United States Patent
Pahl (10) Patent No.: US 9,676,612 B2
(45) Date of Patent: Jun. 13, 2017

(54) COMPONENT WHICH CAN BE PRODUCED AT WAFER LEVEL AND METHOD OF PRODUCTION

(71) Applicant: EPCOS AG, Munich (DE)

(72) Inventor: Wolfgang Pahl, Munich (DE)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 14/787,551

(22) PCT Filed: Mar. 21, 2014

(86) PCT No.: PCT/EP2014/055740
§ 371 (c)(1),
(2) Date: Oct. 28, 2015

(87) PCT Pub. No.: WO2014/177323
PCT Pub. Date: Nov. 6, 2014

(65) Prior Publication Data
US 2016/0075552 A1   Mar. 17, 2016

(30) Foreign Application Priority Data

Apr. 30, 2013   (DE) .................. 10 2013 104 407

(51) Int. Cl.
*H01L 29/84* (2006.01)
*B81B 7/00* (2006.01)
(Continued)

(52) U.S. Cl.
CPC .......... *B81B 7/007* (2013.01); *B81C 1/00238* (2013.01); *B81C 1/00301* (2013.01);
(Continued)

(58) Field of Classification Search
CPC ............. H01L 2224/81; H01L 2224/94; H01L 2224/97; H01L 2924/1461; H01L 2924/00; H01L 2224/0401; H01L 2224/06102; H01L 2224/1403; H01L 2224/1703; H01L 2225/06513; H01L 23/552; H01L 24/06;
(Continued)

(56) References Cited

U.S. PATENT DOCUMENTS 7,145,250 B2 * 12/2006 Maruyama .......... H01L 21/6835
257/778
7,219,825 B2 * 5/2007 Choi .................... B23K 35/262
228/180.22

(Continued)

FOREIGN PATENT DOCUMENTS

DE   102004005668 A1   8/2005
DE   102008025599 A1   1/2009

(Continued)

*Primary Examiner* — Mohammed Shamsuzzaman
(74) *Attorney, Agent, or Firm* — Slater Matsil, LLP (57) ABSTRACT

A component which can be produced at wafer level has a first chip and a second chip connected thereto. The connection is (at least partially) established via a first and a second connecting structure and a first and a second contact structure of the second chip. An adaptation structure between the first chip and the first connecting structure equalizes a height difference between the first and the second contact structure.

9 Claims, 7 Drawing Sheets (51) Int. Cl.
*B81C 1/00* (2006.01)
*H01L 23/00* (2006.01)
*H01L 25/065* (2006.01)
*H01L 25/00* (2006.01)
*H01L 23/552* (2006.01)

(52) U.S. Cl.
CPC ............ *H01L 23/552* (2013.01); *H01L 24/06* (2013.01); *H01L 24/17* (2013.01); *H01L 25/0657* (2013.01); *H01L 25/50* (2013.01); *B81B 7/008* (2013.01); *B81B 7/0064* (2013.01); *B81B 2201/0257* (2013.01); *B81C 2203/0785* (2013.01); *H01L 2224/0401* (2013.01); *H01L 2224/06102* (2013.01); *H01L 2224/1403* (2013.01); *H01L 2224/1703* (2013.01); *H01L 2224/94* (2013.01); *H01L 2224/97* (2013.01); *H01L 2225/06513* (2013.01); *H01L 2924/1461* (2013.01)

(58) Field of Classification Search
CPC ..... H01L 24/17; H01L 25/0657; H01L 25/50; B81B 2201/0257; B81B 7/0064; B81B 7/007; B81B 7/008; B81C 1/00238; B81C 1/00301; B81C 2203/0785
USPC .......... 257/416, 778, 737, 415; 438/25, 124; 228/56.3
See application file for complete search history.

(56) References Cited

U.S. PATENT DOCUMENTS

| | | | |
|---|---|---|---|
| 7,388,281 | B2 | 6/2008 | Krueger et al. |
| 7,673,386 | B2 | 3/2010 | Stelzl et al. |
| 7,868,448 | B2 | 1/2011 | Metzger |
| 8,129,838 | B2 | 3/2012 | Reinert |
| 8,653,657 | B2 * | 2/2014 | Miyata .................... H01L 22/34 257/737 |
| 9,056,760 | B2 | 6/2015 | Feiertag et al. |
| 2001/0032985 | A1 | 10/2001 | Bhat et al. |
| 2002/0151228 | A1 | 10/2002 | Kweon et al. |
| 2005/0104204 | A1 | 5/2005 | Kawakubo et al. |
| 2005/0110161 | A1 * | 5/2005 | Naito ..................... H01L 24/81 257/778 |
| 2006/0131731 | A1 | 6/2006 | Sato |
| 2006/0286718 | A1 | 12/2006 | Ozaki |
| 2009/0059760 | A1 | 3/2009 | Someno et al. |
| 2009/0194829 | A1 | 8/2009 | Chung et al. |
| 2010/0284553 | A1 | 11/2010 | Conti et al. |
| 2013/0069229 | A1 | 3/2013 | Kang et al. |
| 2013/0119492 | A1 * | 5/2013 | Feiertag .............. B81C 1/00238 257/416 |

FOREIGN PATENT DOCUMENTS

| | | |
|---|---|---|
| DE | 102010006132 A1 | 8/2011 |
| EP | 1219565 A1 | 7/2002 |
| JP | 2001203386 A | 7/2001 |
| JP | 2005136399 A | 5/2005 |
| JP | 2005536879 A | 12/2005 |
| JP | 2006318625 A | 11/2006 |
| JP | 2006352617 A | 12/2006 |
| JP | 2009539235 A | 11/2009 |
| WO | 2007137568 A1 | 12/2007 |

* cited by examiner

COMPONENT WHICH CAN BE PRODUCED AT WAFER LEVEL AND METHOD OF PRODUCTION

This patent application is a national phase filing under section 371 of PCT/EP2014/055740, filed Mar. 21, 2014, which claims the priority of German patent application 10 2013 104 407.7, filed Apr. 30, 2013, each of which is incorporated herein by reference in its entirety.

TECHNICAL FIELD

Embodiments of the invention relate to a component that can be produced at wafer level and method of production.

BACKGROUND

The field of use of electrical components is extensive. Many electrical or electronic devices comprise several or many electrical components as discrete or monolithically integrated components. The sustained trend toward miniaturization of electrical devices, for example, mobile wireless devices or portable computers, causes the necessity for miniaturization of the installed components. At the same time, the electrical and mechanical properties of the components cannot be worsened by the reduction in size. The requirements, for example, with respect to the signal quality, for the components often increase.

Small-sized MEMS components having good electrical properties are known from published application DE 10 2010 006 132, wherein a MEMS chip and an ASIC chip (ASIC=application-specific integrated circuit) are arranged in stacked form.

It is possible that MEMS chips carry such complex MEMS structures that the additional arrangement of structures for connection to or interconnection with other elements of the component is made more difficult.

SUMMARY

The invention relates to components, for example, MEMS components (MEMS=micro electromechanical system) such as MEMS microphones, which comprise multiple chips. At least two chips are connectable to one another at wafer level. Furthermore, the invention relates to a method for producing such components.

The component comprises a first chip having an upper side and a second chip having a lower side. The component furthermore comprises a first connecting structure and a second connecting structure, which are each arranged on the upper side of the first chip. A first contact structure and a second contact structure of the component are arranged on the lower side of the second chip. Furthermore, an adaptation structure exists, which has the height $\Delta h$ and is arranged between the first chip and the first connecting structure. The first connecting structure is connected to the first contact structure. The second connecting structure is connected to the second contact structure. The second contact structure is taller by an amount $\Delta h$ than the first contact structure.

The connecting structures are structured elements arranged on the upper side of the first chip, which are used to establish a mechanical and/or electrical connection of the two chips, and have a height which corresponds to the total of all thicknesses of all layers contained in the structures.

The contact structures are structured elements arranged on the lower side of the second chip, which are used, together with the connecting structures, to establish the mechanical and/or electrical connection between the chips, and have a height which corresponds to the total of all thicknesses of all layers contained in the structures.

Therefore, the terms "height" and "thickness" essentially correspond.

It is possible that the second chip has functional structures on its lower side, which make the connection of the two chips more difficult, because the lower side of the second chip together with the functional structures no longer provides a level surface. It is therefore possible that the first contact structure and the second contact structure have different heights, i.e., that the ends thereof spaced apart from the second chip have a different distance from the second chip. A uniform connection of the two chips is thus made more difficult. As a solution to this problem, the adaptation structure on the upper side of the first chip is provided, which is used to arrange the two chips at a homogeneous distance from one another and to connect them—in spite of functional structures on the lower side of the second chip. The height difference of the contact structures $\Delta h$ of the elements on the lower side of the second chip is thus equalized by a similar selected height of the adaptation structure on the upper side of the lower chip.

The connecting structures, the contact structures, and the adaptation structure can be structured by means of lithographic methods on wafers, from which the first and second chips are later isolated. The entire component can therefore be produced at wafer level in multiple panels, whereby the effort for production is reduced, error sources during the production are avoided, and production costs are reduced.

In one embodiment, the first connecting structure and the second connecting structure are of equal height or the layer structures thereof are of equal thickness.

Both connecting structures can then be produced in the same method step. Different distances of the connecting points of the structures to the surface level of the second chip, which are caused by functional structures on the lower side of the second chip, are equalized by the adaptation structure on the upper side of the other chip, namely the first chip.

In one embodiment, circuit elements of the first chip are interconnected via the connecting structures and contact structures with circuit elements of the second chip.

The first chip can be an ASIC chip, while the second chip can be a MEMS chip having MEMS structures. The ASIC chip can then comprise analog and/or digital circuits for activating the MEMS structures or for analyzing the signals received from the MEMS chip.

It is thus possible, for example, that the component is a MEMS microphone and the second chip comprises, as MEMS structures, electrically conductive membranes which can be excited to oscillations or essentially rigid and fixed perforated back plates and a structured cavity in the interior of the second chip as the acoustic back volume. In general, a plurality of structuring steps are required for structuring the membranes, back plates, and the acoustic back volume, wherein a plurality of different connecting and contact structures are required on the lower side of the second chip. These structures cause the lower side of the second chip to have a complex topology, which prevents a simple and direct connection to the first chip.

If the component is to function as a microphone and is to have good electrical and acoustic properties, it can thus be necessary for the volume arranged between the two chips to be enclosed by an acoustically sealing frame, which is closed or closed except for a sound entry opening, and for additional electrical and mechanical connections to be provided between the chips. The acoustically sealing frame is necessary to prevent an acoustic short circuit, i.e., the incidence of acoustic sound waves on the front side and on the rear side of acoustically active structures.

In one embodiment, the component accordingly comprises a completely closed frame structure or a frame structure having a lateral opening, for example, a sound entry opening, wherein the frame structure is formed by one of the connecting structures, one of the contact structures, or a further frame-shaped structure.

The first and the second connecting structures can therefore be used to connect the two chips electrically and/or mechanically to one another or to enclose a cavity between the chips—in spite of functional structures arranged on the lower side of the chip—by way of a formfitting attachment to both chips as an open or closed frame structure.

In one embodiment, one of the connecting structures, one of the contact structures, or a further structure is a support structure.

The component comprising the two chips and the volume between the chips can be inserted into an external circuit environment and can be enclosed by further circuit components or housing components, for example, a molding material. In any case, it is advantageous if the component is mechanically stable and can withstand pressures if necessary, which can occur during further method steps or integration steps. In particular the cavity between the chips would impair the mechanical stability. The provision of further support structures, which are arranged in the cavity and support both chips against one another, i.e., transmit vertical forces, increases the stability of the component, whereby in particular stresses are absorbed by the optional frame structure and the acoustic seal is less endangered.

In one embodiment, the component furthermore comprises an electromagnetic shield of the first chip, the second chip, and/or the entire component.

In one embodiment of the component having an electromagnetic shield, the body of the first chip and the body of the second chip are not directly interconnected with one another via the shield.

It is possible that a metallic material for the electromagnetic shield is arranged on an upper side of the second chip or on lateral surfaces of the second chip. It is also possible that a conductive material for the electromagnetic shield is arranged on the lower side of the first chip or on lateral surfaces of the first chip. Such shields have good electrical coupling to the corresponding chip material, when they are applied over a large area. Depending on which electrical potential is provided for the body of the first chip and the second chip, it can be advantageous to interconnect the bodies of both chips via the large-area electromagnetic shield in a low-resistance manner or to keep both bodies at different potentials. In this case, it is possible to provide an additional layer of an insulating material between the electromagnetic shield and at least one of the two chip bodies, so that an electromagnetic shield does not short-circuit the bodies.

In one embodiment, the first chip is an ASIC chip and the second chip is a MEMS chip.

In one embodiment, the second chip is a MEMS chip having an electrically conductive membrane, a counter electrode, and a back volume. The component is accordingly a microphone.

The number of the electrically conductive membranes or the number of the counter electrodes is not restricted to one. Two or more membranes or two or more counter electrodes can be provided, so that a MEMS microphone having improved acoustic or electrical properties is obtained. In particular, it is possible to arrange one membrane between two counter electrodes or to arrange one counter electrode between two movable membranes, to obtain a differentially operating microphone.

The component can furthermore comprise solder pads, for example, for contacts for SMD mounting (SMD=surface mounted device). ASIC structures, for example, in the first chip, can be arranged on the lower side of the first chip, in the interior of the first chip, or on the upper side of the first chip.

Similarly, MEMS structures can be arranged on the lower side, in the interior, or on the upper side of the second chip.

Through contacts through the first chip or through the second chip can interconnect circuit elements of the corresponding chips or contact structures for interconnection or connection of the component with or to an external circuit environment.

The connecting structures or contact structures, which establish electrical interconnections between the chips, are preferably electrically conductive and can comprise a metal. Other connecting structures or contact structures can comprise a conductive material or a nonconductive material. The adaptation structure can also comprise a conductive material or a nonconductive material. If the adaptation structure comprises a conductive material, it can be part of an electrical interconnection between the chips or between elements of a chip.

If connecting structures and/or contact structures are to both establish an electrical interconnection and are also to comprise a substantially nonconductive material, for example, because of mechanical considerations, it is thus possible to provide connecting metallizations on the upper side of the connecting structures or on the lower side of the contact structures, which accordingly touch one another and establish an electrical interconnection.

Metal—for example, aluminum, copper, nickel, gold, or silver or an alloy comprising a corresponding metal—glass, a polymer, or inorganic modified hybrid polymers come into consideration as materials for the connecting structures, the contact structures, or the adaptation structure. The adaptation structure can also be composed of materials used during the production of ASIC structures. By way of the adaptation of the layer thickness of the adaptation structure or by way of local omission of the adaptation structure in the region of a bond frame between the chips or in the region of connecting studs, different heights of these support elements or connecting elements can be set in a targeted manner to represent the counterpart to the individual topology on the lower side of the second chip.

Bond frames or connecting studs, which consist, for example, of the first two connecting structures or the first two contact structures or further connecting and contact structures, can comprise lacquers, for example, SU8 (Microchem)—or dry films—for example, PerMX (DuPont).

The height $\Delta h$ can be in the range of several micrometers and can be 10 µm, for example.

The height of bond frames or connecting studs, i.e., the total height of the structures, composed of connecting structures and contact structures, can be in the range of several micrometers, for example, between 5 and 200 µm.

It is possible to select a comparatively elastic, plastic, or generally compressible material as the material of a bond frame, to obtain a further height equalization by compression during the joining together of the two chips. The bond frame can then comprise a polymer, for example.

To obtain a stable connection between the connecting structures and the contact structures, a connecting means can be provided on the corresponding connecting point of the structures. Such a connecting means can be, for example, solder or an electrically conductive adhesive.

An electrical insulation layer, which is used to insulate the bodies of the two chips from one another, can comprise, for example, glass, a polymer, inorganic modified hybrid polymers, for example, Ormecer or Parylene.

A material of the electromagnetic shield can comprise a metal, for example, aluminum, copper, nickel, tin, or titanium or an alloy comprising one of these metals. The corresponding materials can be applied by PVD (physical vapor deposition), CVD (chemical vapor deposition), galvanic methods, or currentless metallization and also by jet coating of corresponding precursors or by flame spraying.

If the component is a MEMS microphone, the sound entry opening can thus be implemented by an opening in the first chip or by a lateral sound entry opening through an opening through a frame structure. For acoustic reasons, namely because of better symmetry, a sound entry opening from below through the first chip would be desirable. However, modern, i.e., small MEMS microphones have a specific number of electrical contacts on the correspondingly small lower side, so that the density of the contacts is accordingly high. If the sound entry opening is located on the lower side of the first chip, the risk thus exists during the production of the component that the sound entry opening will be closed by a process material, for example, solder, during the production of the component or during the connection of the component to an external circuit environment.

It can therefore be advantageous to provide the sound entry opening on the side of the component.

A method for producing a component comprises the following steps: preparing MEMS structures and contact structures on a lower side of a second chip, preparing an adaptation structure and contact structures on the upper side of a first chip, and joining together the two chips. The contact structures are connected to the connecting structures and the height of the adaptation structure is selected so that the connection is gap-free in spite of contact structures of different heights.

A gap-free and potentially integrally-joined (for example, by soldered bonds) connection of both chips is thus obtained, although MEMS structures which make connecting the chips more difficult are arranged on the lower side of the second chip.

In one embodiment of the method, the first chips are formed together in a first wafer and the second chips are formed together in a second wafer.

By joining together the corresponding wafers, a plurality of components can be produced simultaneously, which only have to be isolated after the joining together of the wafers.

In one embodiment of the method, it is possible, after the connecting of the two wafers, to separate the second chips from one another by a first partial isolation step. The isolation step penetrates through the material of the second chips and into the material, but not through the material of the connecting structures. The first chips are separated from one another by a second partial isolation step. The second partial isolation step penetrates through the material of the first chips and into the material of the connecting structures.

A base is thus provided for electrically insulating the chip bodies from one another. This applies accordingly for an embodiment of the method in which, after the first partial isolation step, firstly an insulation layer and then a conductive shield layer are applied to the second chips. After the second partial isolation step, a conductive shield layer is applied at least to the isolation edges of the first chips.

BRIEF DESCRIPTION OF THE DRAWINGS

The component or a method for producing a component will be explained in greater detail hereafter on the basis of schematic exemplary embodiments and associated figures. In the figures:

FIG. 1 shows a component B having a first chip CH1, a second chip CH2, and a connection of the chips by means of connecting structures VS, contact structures KS, and an adaptation structure AS;

DETAILED DESCRIPTION OF ILLUSTRATIVE EMBODIMENTS

Figure 1:
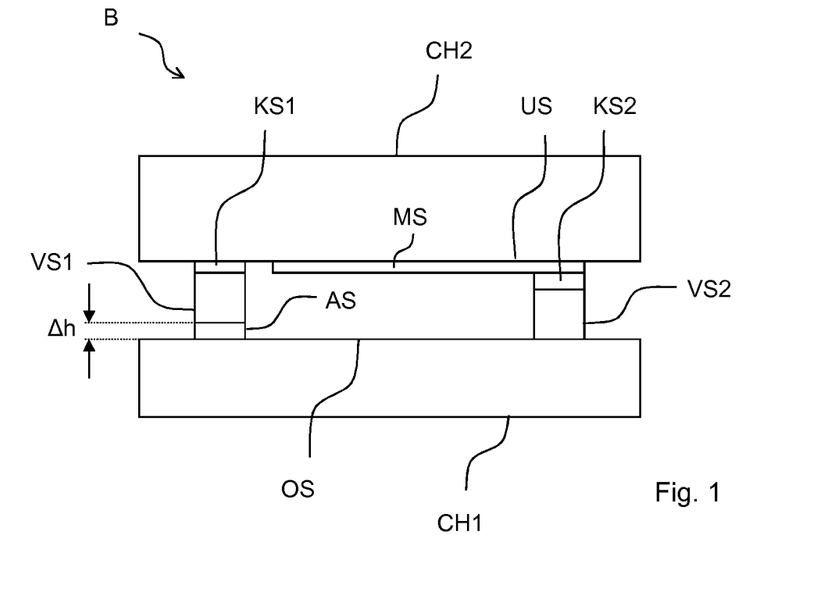

FIG. 1 schematically shows a cross section through a component B having a first chip CH1 and a second chip CH2. The first chip CH1 has an upper side OS, which faces toward the second chip CH2. The second chip CH2 has a lower side US, which faces toward the first chip. Both chips can comprise corresponding sides facing away from the respective other chip. However, it is also possible that the chips have an unconventional shape on the corresponding side facing away and have laterally beveled outer sides, for example.

The second chip CH2 is a MEMS chip having MEMS structures MS on the lower side US of the second chip CH2. A connection and interconnection of the two chips CH1, CH2 is performed via a first and second connecting structure VS1, VS2 and via a first contact structure KS1, KS2. In order that the corresponding connecting and contact structures can be produced in a simple manner and accordingly using similar method steps, they advantageously have the same height and comprise the same material. Since the MEMS structures MS on the lower side US of the second chip CH2 can now cause the necessity of the contact surfaces of the second contact structure KS2 to be more remote from the lower side US of the second chip CH2 than the corresponding contact surface of the first contact structure KS1, and since first and second connecting structures VS1, VS2 of equal height are advantageous with respect to the processing, a direct arrangement of the two connecting structures VS1, VS2 on the upper side OS of the first chip CH1 would not result in optimum connection of the two chips. Accordingly, at least under the first connecting structure VS1, an adaptation structure AS is arranged, which equalizes the different distance of the connecting surfaces of the contact structures to the lower side of the second chip. The thickness of the adaptation structure Δh is therefore preferably essentially equal to the difference of the distances of the contact surfaces of the contact structures to the lower side US of the second chip CH2.

If the adaptation structure is absent, a component having chips connected "diagonally" could thus result if the connecting structures and the contact structures would only represent locally arranged connecting elements. However, if it is desirable to enclose the volume between the chips and possibly even seal it off acoustically, connecting both chips without the adaptation structure AS would no longer be possible.

Figure 2:
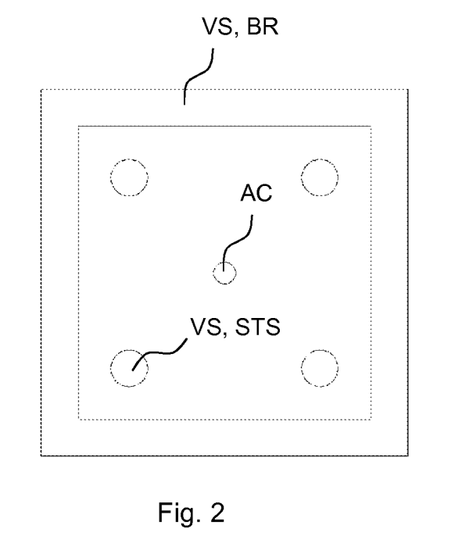
FIG. 2 shows a possible arrangement of a bond frame and connecting and support structures of an embodiment having an acoustic channel AC through the first chip.

FIG. 2 shows a top view of the first chip, wherein one of the connecting structures VS is embodied as a bond frame BR, which is arranged on the edge of the first chip and comprises a closed volume between the chips.

Further locally arranged connecting structures VS are arranged as support elements STS, to ensure the mechanical stability of the component, in particular the cavity, and optionally to establish electrical interconnections between the chips.

An acoustic channel AC is guided through the body of the first chip and enables the entry of acoustic waves into the component.

Figure 3:
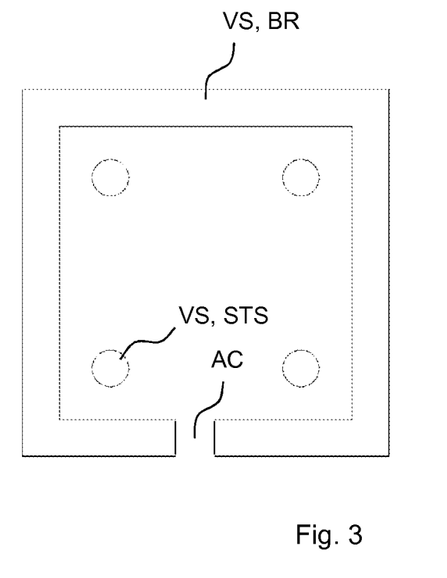
FIG. 3 shows an embodiment having a bond frame and connecting and support structures and an acoustic channel through a non-closed bond frame.

FIG. 3 shows an embodiment in which the acoustic channel through the body of the first chip is omitted and it is instead led through an opening in the bond frame BR.

The risk of the closure of the acoustic channel by liquid materials used during the production of the component or during the connection of the component to an external circuit environment is therefore reduced.

Figure 4:
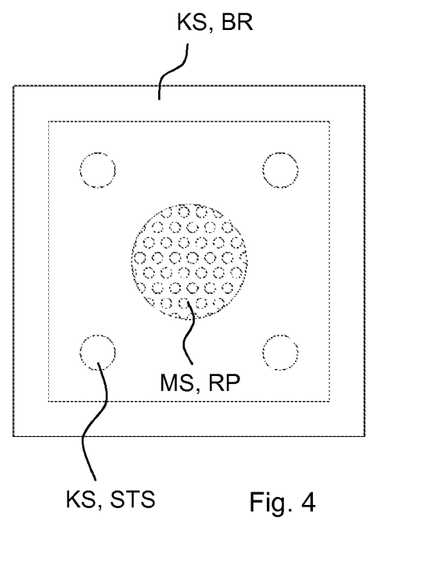
FIG. 4 shows the upper section of a component associated with FIG. 2.

FIG. 4 shows the corresponding view of the second chip, wherein support structures STS are neither arranged as the bond frame BR nor are provided to be interconnected with or connected to the frame-shaped connecting structure of FIG. 2. While connecting and contact structures can also have electrical functions in addition to the mechanical function, such structures are also usable as support structures without electrical function.

Figure 5:
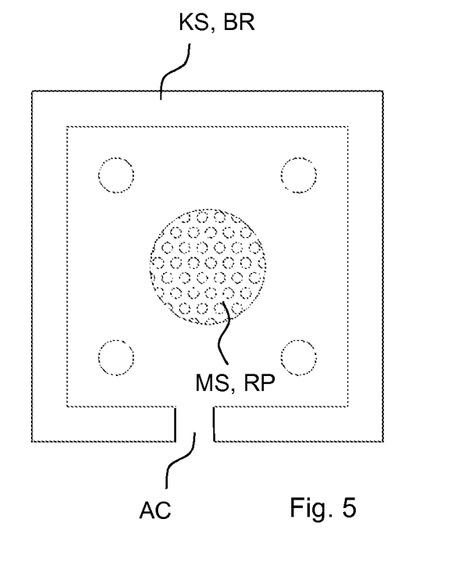
FIG. 5 shows the upper section of a component associated with FIG. 3.

FIG. 5 shows the view of the second chip associated with FIG. 3, wherein the contact structure is also embodied as a frame-shaped structure and has a sound entry opening in the form of an acoustic channel AC.

Figure 6:
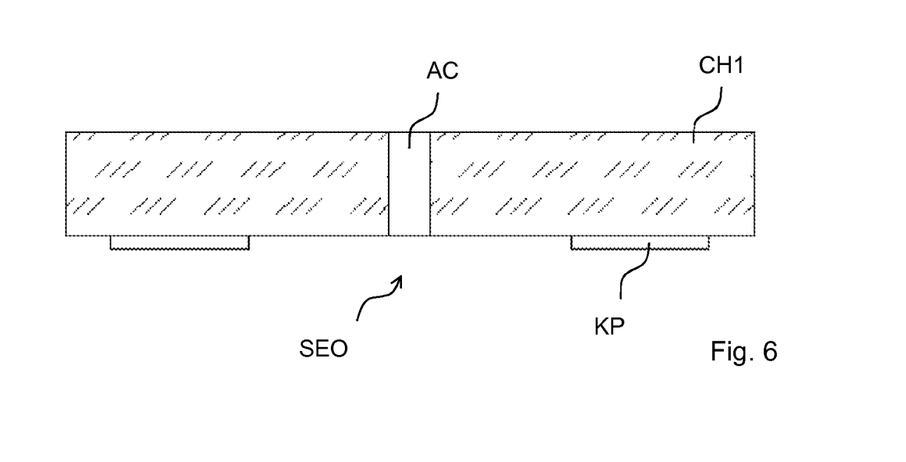
FIG. 6 shows a cross section through a first chip having an acoustic channel.

FIG. 6 shows a first intermediate step during the production of a MEMS microphone, wherein contact pads KP for interconnection of the component with an external circuit environment are arranged on a lower side of the first chip CH1. An acoustic channel AC through the body of the first chip CH1 provides a sound entry opening SEO for sound waves. Through contacts through the chip, for example, to the contact pads on the lower side of the chip, are possible. They can be arranged adjacent to the channel independently of the acoustic channel. It is also possible that the channel AC itself carries metallic structures as through contact on its inner side.

Figure 7:
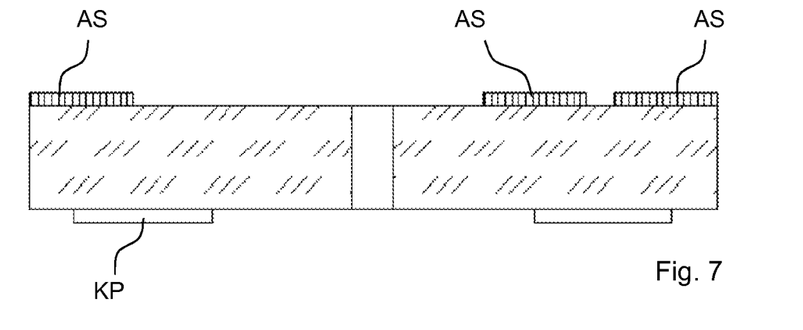
FIG. 7 shows an intermediate step during the production of a component.

FIG. 7 shows a later intermediate step, in which local adaptation structures AS are arranged on the upper side of the first chip, to equalize height differences which are caused by MEMS structures on the lower side of the second chip.

Figure 8:
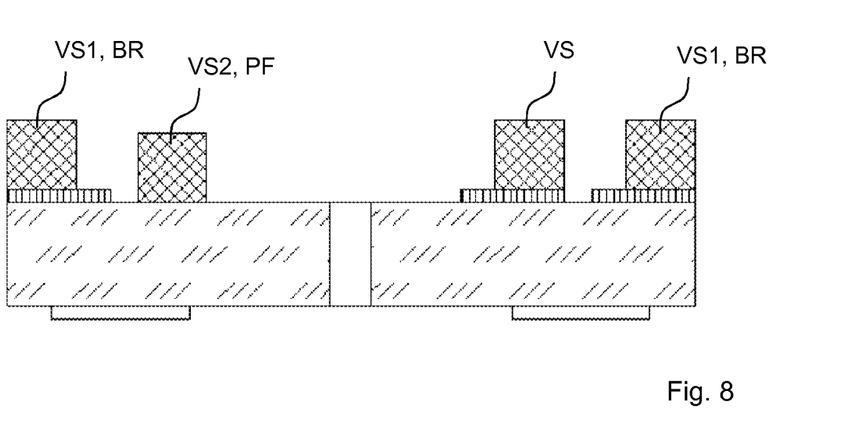
FIG. 8 shows a further intermediate step.

FIG. 8 shows a later intermediate step, wherein a first connecting structure VS1 in the form of a bond frame BR is arranged on the material of the adaptation structure AS. A second connecting structure VS2 is arranged in the form of a support stud PF on the upper side of the first chip, wherein no adaptation structure is arranged between the second connecting structure and the material of the first chip. A further connecting structure VS, for example, in the form of a support structure or a support stud, is arranged on the material of the adaptation structure.

The connecting structures VS are essentially used to establish a connection to corresponding contact structures on the lower side of the second chip. The selective arrangement of the adaptation structure below the connecting structures enables the leveling of the two chips in spite of the connection of obstructing MEMS structures on the lower side of the second chip.

Figure 9:
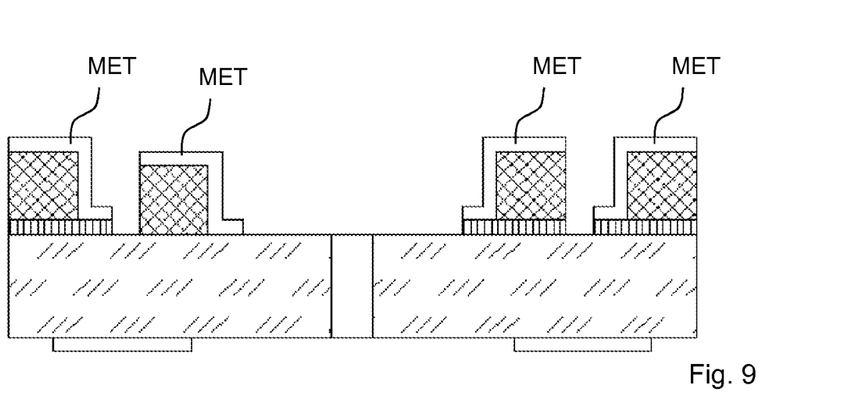
FIG. 9 shows a further intermediate step.

FIG. 9 shows metallizations MET arranged on the connecting structures, so that an electrical interconnection can also be established via the mechanical connection of the connecting structure, for example, if the material of the connecting structures VS has little or no electrical conductivity. The metallizations can be interconnected with conductive structures, for example, signal lines, on the surface of the first chip or with through contacts through the first chip.

Figure 10:
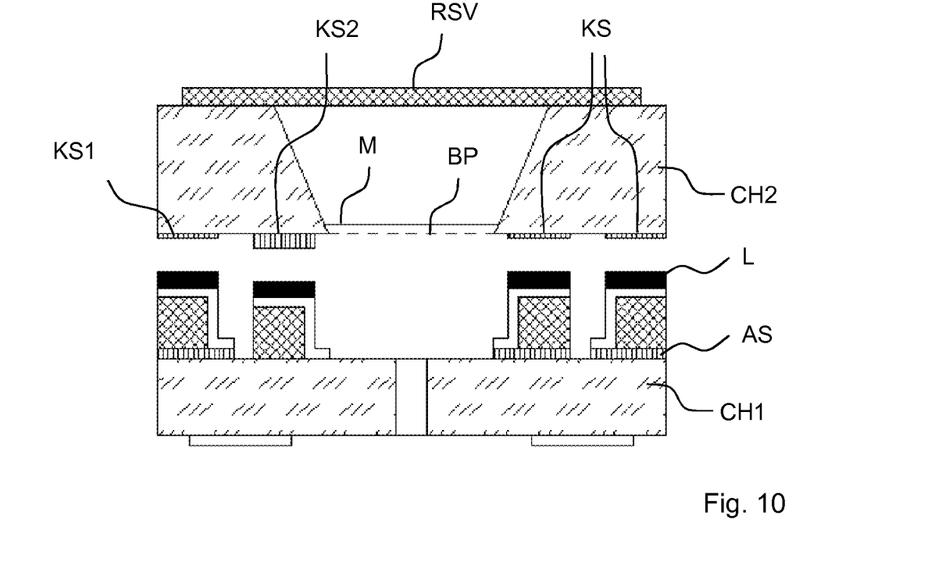
FIG. 10 shows a further intermediate step.

FIG. 10 shows a further method step, wherein different heights of corresponding first and second contact structures KS1, KS2 are given by way of MEMS structures on the lower side of the second chip CH2. In the case of MEMS microphones, the different heights of the contact structures are primarily caused by structuring steps of membranes M and back plates BP. A solder material L is furthermore arranged on the metallizations on the connecting structures of the first chip CH1, to enable a soldered bond of the two chips.

Furthermore, a back volume covered by a rear panel RSV is arranged in the second chip as the back volume of the MEMS microphone.

Figure 11:
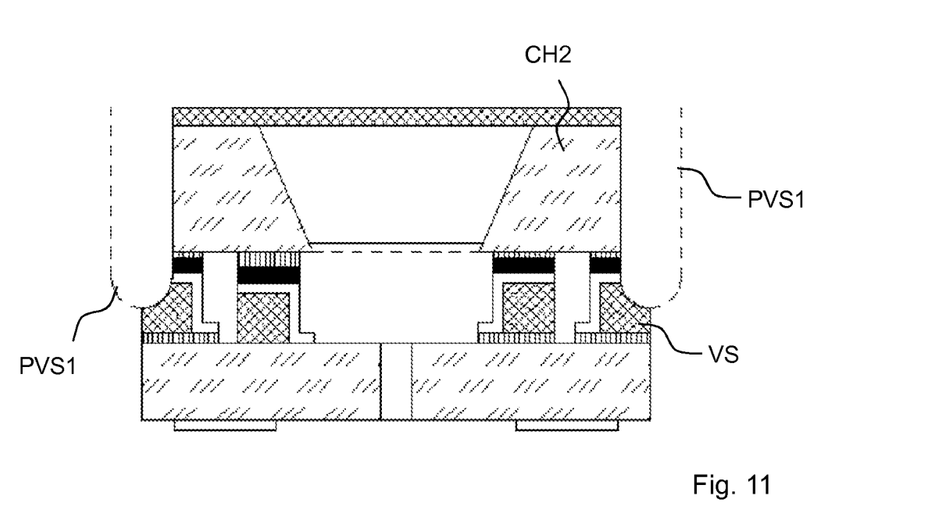
FIG. 11 shows a further intermediate step.

FIG. 11 shows a further intermediate product, wherein a soldered bond connects and interconnects the two chips or the contact and connecting structures thereof.

For the sake of simplicity, only individual components are always shown, which can be provided, however, in multiple panels in a plurality as elements of the corresponding wafers. FIG. 11 shows how individual second chips CH2 were separated from one another by first partial isolation steps, for example, by sawing.

The first partial isolation step penetrates through the material of the second chip and into the material of the connecting structures VS.

Figure 12:
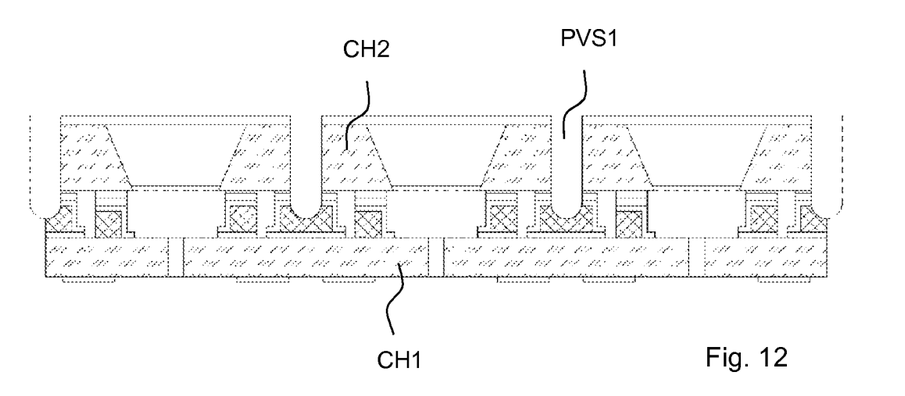
FIG. 12 shows the further intermediate step of FIG. 11 illustrated by the arrangement of the chips in multiple panels.

FIG. 12 illustrates how the first partial isolation steps PVS1 are carried out multiple times at wafer level and separate the individual second chips from one another.

Figure 13:
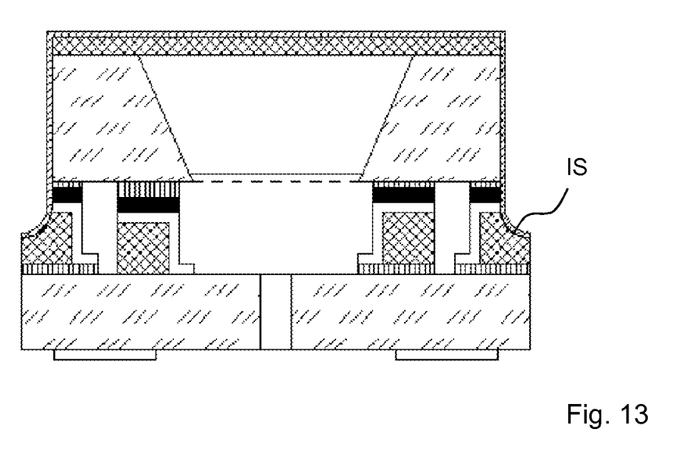
FIG. 13 shows a further intermediate step.

FIG. 13 shows a further intermediate product, wherein an insulating material IS was applied to the rear side of the rear panel and to the lateral surfaces of the second chips.

Figure 14:
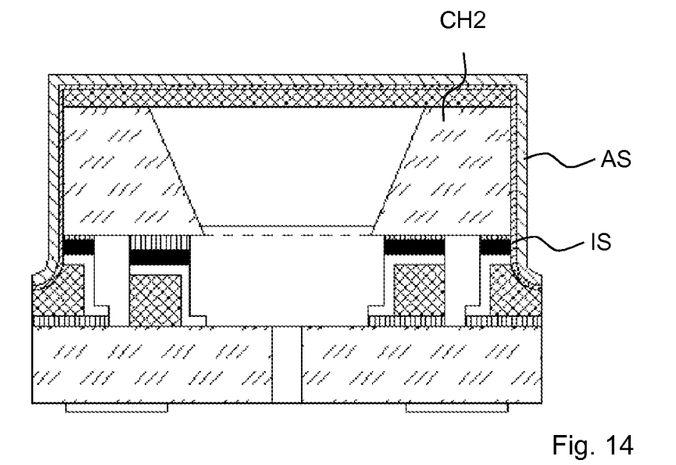
FIG. 14 shows a further intermediate step.

FIG. 14 shows a further intermediate product, wherein an electrically conductive shield layer AS was applied to the insulating layer IS. The shield layer AS is insulated from the body of the second chip CH2 by the insulating layer IS.

Figure 15:
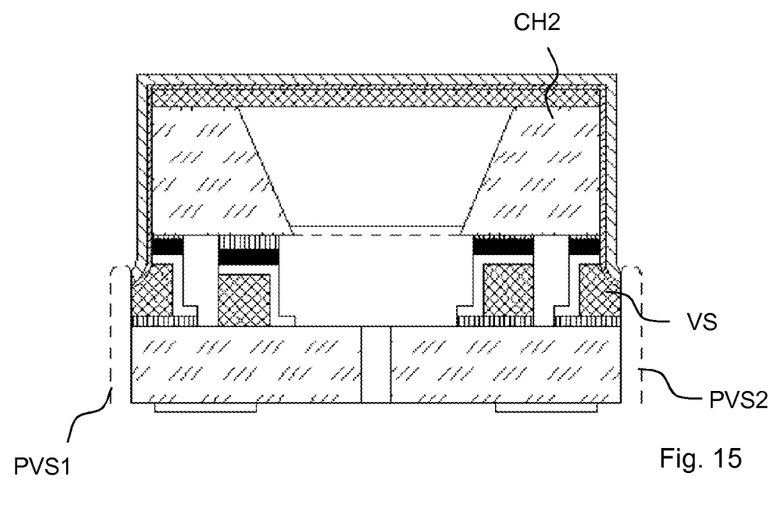
FIG. 15 shows a further intermediate step.

FIG. 15 shows a further intermediate product after a second partial isolation step PVS2, wherein the material of the first chip has been penetrated and the second partial isolation step PVS2 penetrates at least partially into the material of the connecting structure VS.

Figure 16:
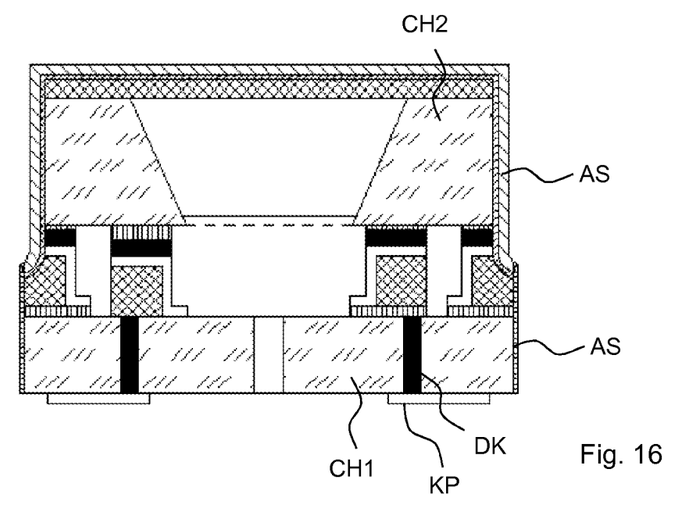
FIG. 16 shows a final product of a production method for providing a MEMS microphone.

FIG. 16 shows the final product, wherein a material of a further shield layer AS is arranged on the isolation edges of the first chip or the adaptation structure and the connecting structure. The material of the lower adaptation layer touches the material of the upper adaptation layer, so that a continuous electromagnetic shield is obtained. At the same time, the body of the first chip is electrically insulated by the insulation layer IS from the body of the second chip.

If there is no necessity of insulating the body of the first chip from the body of the second chip, a single complete isolation step and a single deposition step are thus sufficient to apply the electromagnetic shield layer AS to the lateral surfaces and the rear side of the component.

The support and contact structures can be interconnected, for example, via through contacts DK with the contact pads KP on the lower side of the first chip CH1. A simple but effective possibility is thus provided for interconnecting the internal interconnection of the component with an external circuit environment.

The component and the production method are not restricted to the described exemplary embodiments and schematic illustrations. Combinations of individual features and variations which comprise, for example, still further coatings, layers, connecting or adaptation structures, or contact structures, also represent exemplary embodiments.

The invention claimed is:

1. A component comprising:
   a first chip having an upper side;
   a second chip having a lower side, the second chip being a MEMS chip;
   a first connecting structure and a second connecting structure on the upper side of the first chip;
   a first contact structure and a second contact structure on the lower side of the second chip; and
   an adaptation structure between the first chip and the first connecting structure,
   wherein the first connecting structure is connected to the first contact structure and the second connecting structure is connected to the second contact structure through metallizations on the connecting structures and a solder material on the metallizations,
   wherein the connecting and contact structures have the same height,
   wherein a contact surface of the second contact structure is more remote from the lower side of the second chip than a corresponding contact surface of the first contact structure,
   wherein a thickness of the adaptation structure is equal to a difference in distances between the contact surfaces of the contact structures and the lower side of the second chip given by way of MEMS structures on the lower side of the MEMS chip, and
   wherein the adaption structure is a single integral piece directly connected to the upper side of the first chip.

2. The component according to claim 1, wherein the first chip is an ASIC chip,
   wherein the second chip comprises an electrically conductive membrane, a counter electrode, and a back volume, and wherein the component is a microphone.

3. The component according to claim 1, wherein circuit elements of the first chip are interconnected with circuit elements of the second chip via the connecting structures and the contact structures.

4. The component according to claim 1, further comprising a frame structure that is complete or has a lateral opening, wherein the frame structure is formed by one of the connecting structures, one of the contact structures, or a further frame-shaped structure.

5. The component according to claim 1, wherein one of the connecting structures or one of the contact structures serves as a support structure.

6. The component according to claim 1, further comprising a support structure separate from the connecting structures and the contact structures.

7. The component according to claim 1, further comprising an electromagnetic shield for the first chip, the second chip, or the entire component.

8. The component according to claim 7, wherein a body of the first chip and a body of the second chip are not directly interconnected via the shield.

9. The component according to claim 1, wherein the first chip is an ASIC chip.

* * * * *